United States Patent [19]

Gillig

[11] 4,455,534
[45] Jun. 19, 1984

[54] MULTI-STATE CONTROL CIRCUITRY
[75] Inventor: Steven F. Gillig, Carol Stream, Ill.
[73] Assignee: Motorola, Inc., Schaumburg, Ill.
[21] Appl. No.: 316,619
[22] Filed: Oct. 30, 1981
[51] Int. Cl.³ ............................................. H03F 1/14
[52] U.S. Cl. ........................................ 330/51; 330/9; 330/107; 330/298
[58] Field of Search ................... 330/51, 9, 107, 109, 330/298; 307/362

[56] References Cited
U.S. PATENT DOCUMENTS

| | | |
|---|---|---|
| 3,577,080 | 5/1971 | Cannalte . |
| 3,659,208 | 4/1972 | Fussell . |
| 3,813,665 | 5/1974 | Parfomak et al. ................. 328/148 |
| 3,906,166 | 9/1975 | Cooper et al. . |
| 3,978,412 | 8/1976 | Frerking . |
| 3,984,644 | 10/1976 | Matz . |
| 3,989,961 | 11/1976 | Masreliez . |
| 4,117,406 | 9/1978 | Takahashi et al. . |
| 4,268,793 | 5/1981 | Amazawa et al. . |

OTHER PUBLICATIONS

"Portable Telephones for Cellular Systems", by Albert J. Leitich & Donald L. Linder, Motorola, Inc., Chicago Corporate R&D Center, 80CH1601-4, Copyright 1980, Vehicular Technology Society IEEE.
FCC Form #401–"An Application for a Developmental Cellular Mobile and Portable Radio Telephone System in the Washington–Baltimore Northern Virginia Area," submitted by: American Radio Telephone Service, Inc.,–1600 Crt. Sqr. Building–Baltimore MD 21202, pp. 4–76 through 4–86.

Primary Examiner—James B. Mullins
Assistant Examiner—G. Wan
Attorney, Agent, or Firm—Rolland R. Hackbart; Ed Roney; James W. Gillman

[57] ABSTRACT

Multi-state control circuitry is described that can selectively couple an input signal to the positive and negative inputs of an operational amplifier depending on the voltage of a control signal. The input signal is coupled to the operational amplifier by a switch, which is enabled or disabled by the output of a voltage detector. The voltage detector enables the switch when the voltage of the control signal is less than a threshold voltage, and disables the switch when the voltage of the control signal is greater than the threshold voltage. The amplification of the operational amplifier is switched between $+1$ and $-1$ by selectively coupling a DC voltage to the positive input of the operation amplifier, depending on the current of the control signal. The DC voltage is coupled to the positive input of the operational amplifier by a second switch, which is enabled or disabled by a current detector. The current detector enables the second switch when the current of the control signal is less than a threshold current, and disables the second switch when the current of the control signal is greater than the threshold current.

17 Claims, 6 Drawing Figures

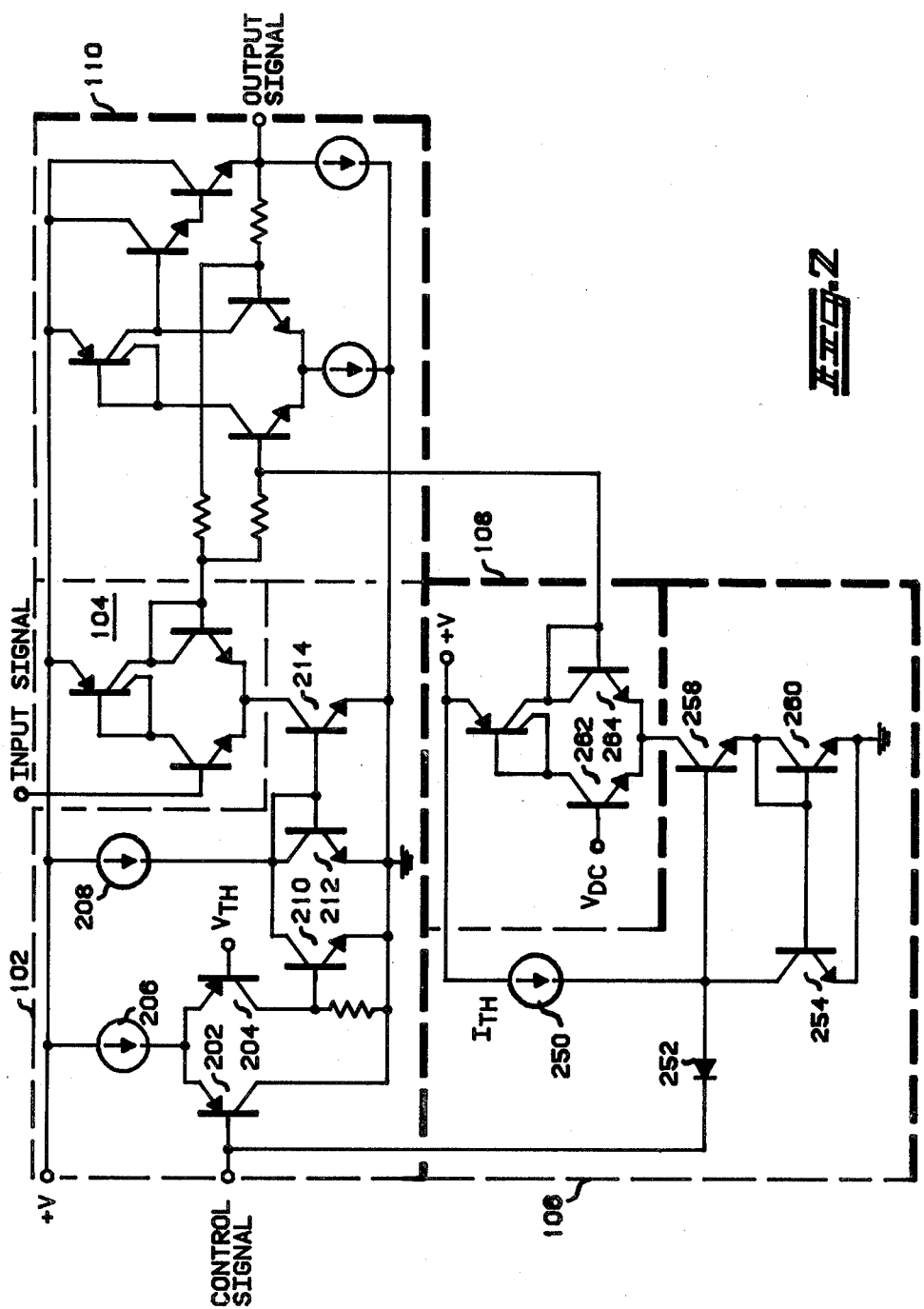

MULTI-STATE CONTROL CIRCUITRY

RELATED PATENT APPLICATIONS

The instant application is related to the following U.S. patent applications concerned with a portable radiotelephone, filed on Sept. 15, 1980 and assigned to the same assignee as the instant application: Ser. No. 187,304, by Larry C. Puhl et al., entitled "Microprocessor Controlled Radiotelephone Transceiver;" Ser. No. 187,306, U.S. Pat. No. 4,390,963 by Larry C. Puhl et al., entitled "Interface Adapter Architecture;" Ser. No. 187,302, U.S. Pat. No. 4,434,461 by Larry C. Puhl, entitled "Communications Microprocessor Architecture;" Ser. No. 187,305, U.S. Pat. No. 4,398,265 by Larry C. Puhl et al., entitled "Keyboard and Display Interface Adapter Architecture;" and Ser. No. 187,303, U.S. Pat. No. 4,369,516 by John P. Byrns, entitled "Self-Clocking Data Transmission System and Method Therefor". The instant application is also related to U.S. patent applications, Ser. No. 119,603, U.S. Pat. No. 4,312,074 by Kenneth A. Felix and James A. Pautler, entitled "Improved Method and Apparatus for Detecting a Data Signal Including Repeated Data Words," and Ser. No. 119,350, U.S. Pat. No. 4,302,845 by John P. Byrns and Michael J. McClaughry, entitled "Phase-Encoded Data Signal Demodulator," both of which were filed on Feb. 7, 1980, and are assigned to the instant assignee. By reference thereto, the foregoing related patent applications are incorporated in their entirety into the instant application.

BACKGROUND OF THE INVENTION

The present invention is related generally to control circuitry, and more particularly to improved multi-state control circuitry having one control signal for controlling a plurality of functions.

In order to reduce the size, weight and power consumption of complex circuits, it is desirable to place such complex circuits onto integrated circuits. However, integrated circuits impose limits on the number of interconnect signals that may be accomodated. When such complex circuitry provides many different functions, one control signal is typically required for each of the functions. As a result, the number of functions provided by the circuitry placed on an integrated circuit is limited by the number of interconnect signals that can be accommodated. Thus, if the number of control signals can be reduced, more circuitry can be placed onto an integrated circuit.

SUMMARY OF THE INVENTION

Accordingly, it is an object of the present invention to provide improved multi-state control circuitry having a single control signal for controlling a plurality of functions.

It is another object of the present invention to provide improved multi-state control circuitry having a single control signal for controlling the combining and amplifying of a plurality of input signals.

It is a further object of the present invention to provide improved multi-state control circuitry which reduces the number of interconnect signals to an integrated circuit by controlling functions of circuitry thereon with a single control signal.

According to an embodiment of the present invention, multi-state control circuitry includes one or more voltage detectors and one or more current detectors which detect different voltage levels and current levels, respectively, of a control signal for selectively coupling various input signals to output signal utilization circuitry, such as an operational amplifier. Each of the voltage detectors and current detectors is coupled to corresponding switches which couple or decouple input signals to the output signal utilization circuitry. The control signal may have two or more voltage levels and two or more current levels depending on the number of input signals to be controlled. For example, different voltage levels or current levels may be used to select different input signals, different amounts of amplification for the same input signal or to control the muting of an input signal. Furthermore, in an exemplary embodiment of the present invention, the voltage and current levels of the control signal provide for either muting or positive or negative amplification of an input signal, and in another embodiment, for either muting or selective combining and amplification of two or more input signals. Since many functions can be controlled by one control signal, the number of interconnection to the output signal utilization circuitry is greatly reduced by the present invention.

BRIEF DESCRIPTION OF THE DRAWINGS

FIG. 2 is a detailed circuit diagram of the amplifying circuitry in FIG. 1.

DETAILED DESCRIPTION OF THE PREFERRED EMBODIMENT

Figure 1:
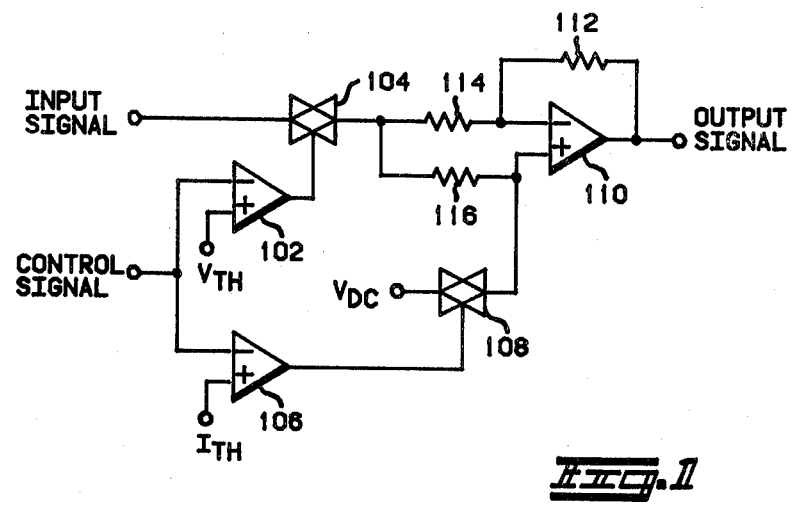
FIG. 1 is a block diagram of amplifying circuitry embodying the present invention.

In FIG. 1, there is illustrated a block diagram of amplifying circuitry utilizing the multi-state control circuitry of the present invention to provide for either the muting of an input signal or for positive or negative amplification of the input signal. The circuitry in FIG. 1 includes a voltage detector 102 and a current detector 106, whose outputs enable or disable switches 104 and 108 in response to the voltage and current of a control signal, respectively. Switch 104, when enabled, couples the input signal via resistors 114 and 116 to operational amplifier 110. Switch 108 couples DC voltage $V_{dc}$ to the positive input of operational amplifier 110.

Voltage detector 102 is responsive to the voltage of a control signal for enabling or disabling switch 104. A positive output from voltage detector 102 enables switch 104, and a zero output disables switch 104. When switch 104 is enabled, the input signal is coupled to both resistors 114 and 116 which are in turn coupled to the negative input and positive input, respectively, of operational amplifier 110. When switch 104 is disabled, the input signal is decoupled from resistors 114 and 116. Voltage detector 102 disables switch 104 when the voltage of the control signal exceeds threshold voltage $V_{th}$. The control signal may typically have one of two voltage levels, a first voltage level being less than threshold voltage $V_{th}$ and a second voltage level being greater than threshold voltage $V_{th}$. The first voltage level enables switch 104, and the second voltage level disables switch 104. Thus, the control signal unmutes the input signal in response to the first voltage level and mutes the input signal in response to the second voltage level.

Assuming that switch 108 is disabled, operational amplifier provides positive amplification to the input signal, since the input signal is coupled to both its negative and positive inputs by means of resistors 114 and 116. The magnitude of the positive amplification provided by operational amplifier 110 is +1, the magnitude of resistors 112, 114 and 116 having essentially no effect on the positive amplification of operational amplifier 110. In the preferred embodiment, resistors 112 and 116 have been selected to have the same value as resistor 114.

Current detector 106 detects the current of the control signal and enables or disables switch 108 depending on whether the current of the control signal is less than or greater than threshold current $I_{th}$, respectively. A positive output from current detector 106 enables switch 108, and a zero output disables switch 108. When switch 108 is enabled, DC voltage $V_{dc}$ is coupled to the positive input of operational amplifier 110. Operational amplifier 110 provides negative amplification to the input signal when DC voltage $V_{dc}$ is applied by switch 108 to its positive input. The magnitude of the negative amplification of operational amplifier 110 is determined by the ratio of feedback resistor 112 to resistor 114, which are equal in magnitude in the preferred embodiment. Thus, the amplification of operational amplifier 110 is switched between −1 and +1 by selectively coupling or decoupling DC voltage $V_{dc}$ to the positive input of the operational amplifier 110.

In summary, the inventive amplifying circuitry illustrated in FIG. 1 mutes or unmutes the input signal and negatively amplifies or positively amplifies the input signal depending on the voltage and current of the control signal. Thus, two functions and their various practical combinations are controlled by varying the voltage and current of a single control signal. The output signal from operational amplifier 110 in FIG. 1 is either muted, +A, or −A, where A is the input signal.

In FIG. 2, there is illustrated a detailed circuit diagram of the various blocks in the amplifying circuitry in FIG. 1. The transistor circuitry in FIG. 2 corresponding to blocks in FIG. 1 has been identified with the same reference numeral and enclosed in dashed lines. The transistor circuitry 110 in FIG. 2 is a conventional circuit diagram of an operational amplifier, and the transistor circuitry 104 and 108 are likewise conventional transistor circuits for differential switches.

The transistor circuitry for voltage detector 102 in FIG. 2 includes a differential pair of transistors 202 and 204 which conduct the current from current source 206 depending on the magnitude of the voltages at their base inputs. Thus, if the voltage of the control signal is less than threshold voltage $V_{th}$, transistor 202 is turned on and conducts the current from current source 206. Conversely, if the voltage of the control signal is greater than threshold voltage $V_{th}$, transistor 204 conducts the current from current source 208 and turns on transistor 210. When transistor 210 turns on, it conducts the current from current source 208 and turns off transistors 212 and 214. When transistors 212 and 214 turn off, differential switch 104 decouples the input signal from operational amplifier 110. When the voltage of the control signal is less than threshold voltage $V_{th}$, transistor 202 conducts the current from current source 206 and transistor 210 is shut off. As a result, the current from current source 208 turns on transistors 212 and 214 enabling differential switch 104 to couple the input signal to the operational amplifier 110.

The transistor circuitry for current detector 106 in FIG. 2 includes a current source 250 for providing threshold current $I_{th}$, which is coupled to diode 252 and transistors 254 and 258. When the control signal is sinking a current by way of diode 252 that is less than threshold current $I_{th}$, transistors 254, 258 and 260 are turned on, enabling differential switch 108 to couple DC voltage $V_{dc}$ to operational amplifier 110. If the control signal sinks a current by way of diode 252 that is greater than or equal to threshold current $I_{th}$, transistors 254, 258 and 260 are turned off, disabling differential switch 108 and decoupling DC voltage $V_{dc}$ from operational amplifier 110.

The transistor circuitry in the detailed circuit diagram in FIG. 2 can be realized with conventional electrical devices, and can be integrated into a suitable semiconductor substrate by conventional technique. By utilizing the present invention, the number of external connections to a semiconductor substrate is minimized, the only connections being for the control signal, the input signal, the output signal, the DC power supply and signal ground. Circuitry for generating the control signal can be any suitable conventional circuitry that generates two output voltages, one voltage being greater than and the other voltage being less than voltage threshold $V_{th}$, and that sinks two currents, one current being less than and the other current being greater than current threshold $I_{th}$. For example, control signal generating circuitry may be similar to differential switch 108, where two voltages are selectively coupled to the $V_{dc}$ terminal, two currents are selectively coupled to the emitters of transistors 262 and 264, and the control signal is provided at the base of transistor 264.

Figure 3:
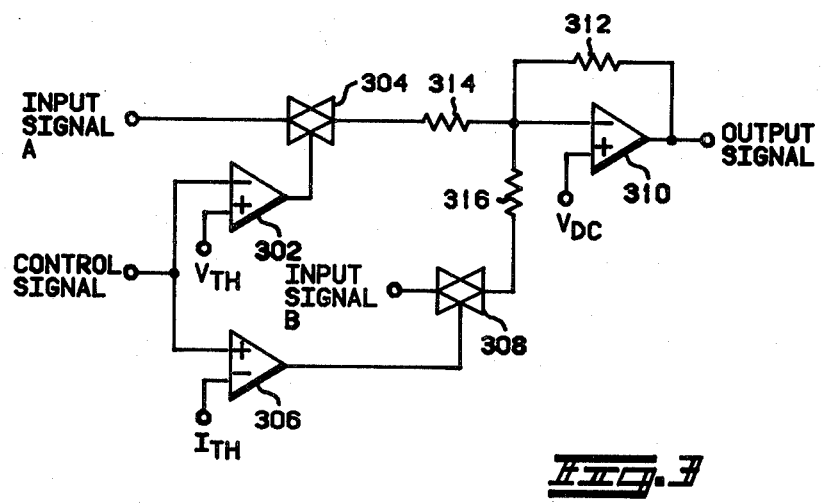
FIG. 3 is a block diagram of another arrangement of amplifying circuitry embodying the present invention.

According to another feature of the present invention, amplifying control circuitry can be arranged as illustrated in FIG. 3, where two input signals are selectively coupled to operational amplifier 310. Depending upon the current and voltage of the control signal, the output signal from operational amplifier 310 is either muted, $-K_1A$, $-K_2B$, or $-K_1A-K_2B$, where A is input signal A, B is input signal B, $K_1$ is the ratio of resistor 312 to resistor 314 and $K_2$ is the ratio of resistor 312 to resistor 316. Since the positive terminal of operational amplifier 310 is coupled to DC voltage $V_{dc}$, operational amplifier 310 provides negative amplification to signals coupled to resistors 314 and 316. The magnitude of the amplification, $K_1$ and $K_2$, provided by operational amplifier 310 is determined by the magnitude of feedback resistor 312 and the magnitude of resistors 314 and 316, respectively. By varying the magnitude of resistors 314 and 316, the amplification, $K_1$ and $K_2$, of the corresponding input signals can be adjusted to meet the needs of a particular application.

Figure 4:
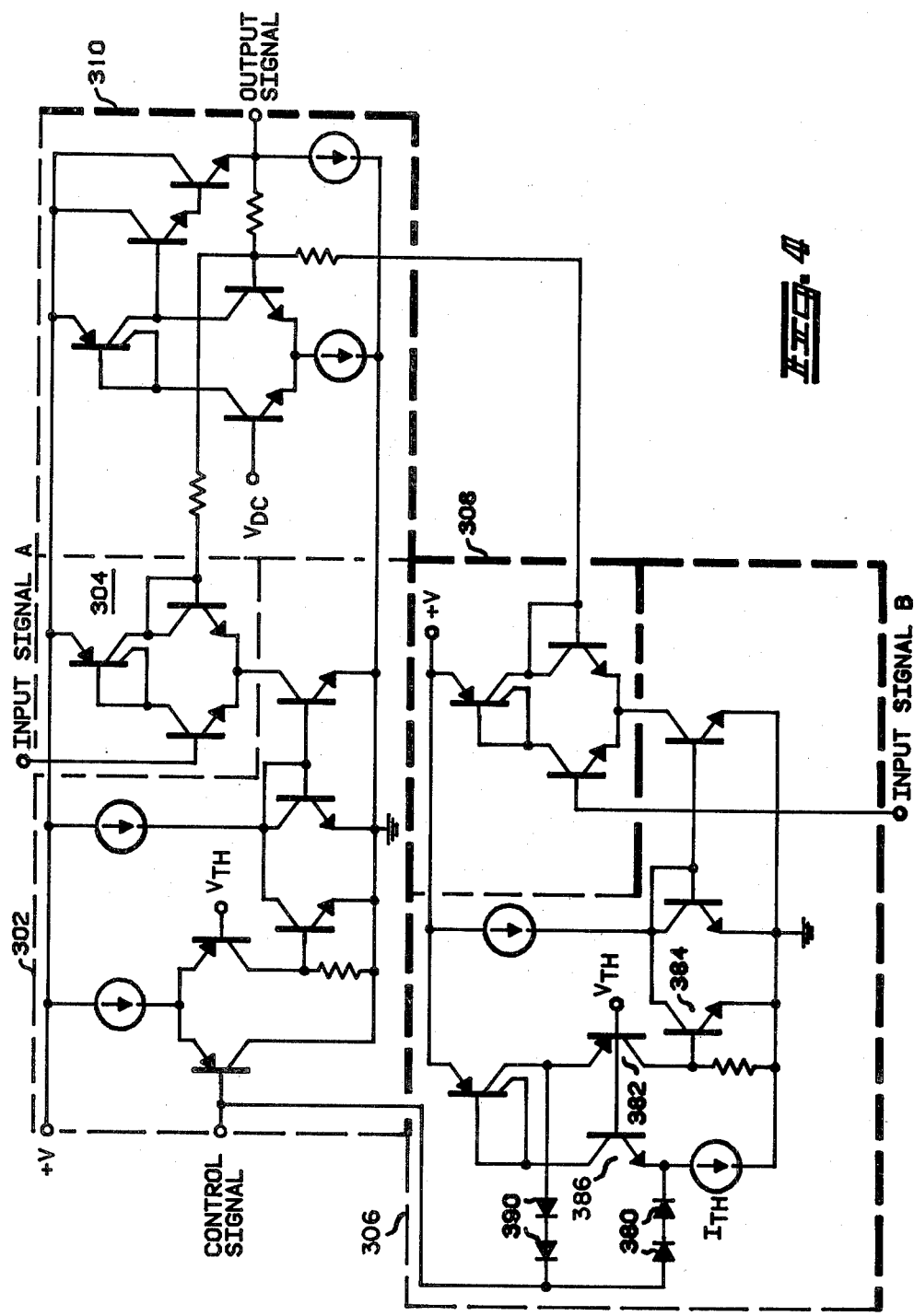
FIG. 4 is a detailed circuit diagram of the amplifying circuitry in FIG. 3.

In FIG. 4, there is illustrated a detailed circuit diagram of the various blocks in the amplifying circuitry in FIG. 3. The transistor circuitry in FIG. 4 corresponding to blocks in FIG. 3 has been identified by the same reference numeral and enclosed in dashed lines. Furthermore, the transistor circuitry in FIG. 4 is substantially identical to the transistor circuitry in FIG. 2, except for the circuitry of current detector 306 and the connections of input signal B to switch 308, resistor 316 to the negative input of operational amplifier 310 and reference voltage $V_{dc}$ to the positive input of operational amplifier 310.

Referring to transistor circuitry for current detector 306, if the control signal sources a current by way of diodes 380 that is equal to or greater than threshold current $I_{th}$, transistors 382, 384 and 386 turn off thereby enabling differential switch 308. If the control signal sinks a current by way of diodes 390 that is greater than or equal to threshold current $I_{th}$, transistors 382 and 384 turn off thereby enabling differential switch 308. If the control signal sources a current by way of diodes 380 that is less than threshold current $I_{th}$, transistors 382, 384 and 386 turn on thereby disabling differential switch 308. If the control signal sinks current by way of diodes 390 that is less than threshold current $I_{th}$, transistors 382 and 384 also turn on thereby disabling differential switch 308. The rest of the transistor circuitry in FIG. 4 operates identically to corresponding circuitry in FIG. 2.

Figure 5:
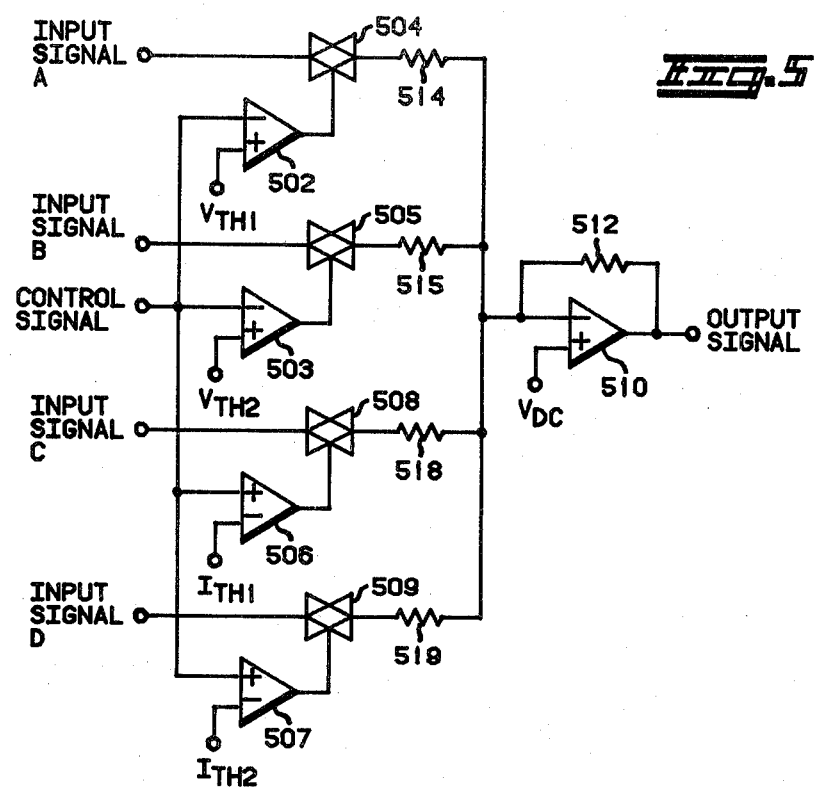
FIG. 5 is a block diagram of yet another arrangement of amplifying circuitry embodying the present invention.

According to yet another feature of the present invention, amplifying circuitry can be arranged as shown in FIG. 5, where four input signals are selectively coupled to operational amplifier 510. The circuitry in FIG. 5 illustrates that the present invention can readily accommodate any practical number of input signals. In order to accommodate each additional input signal, a voltage detector or a current detector together with a switch and coupling resistor is all that is required. Then, depending on the signal combinations desired, the voltage thresholds and current thresholds can be appropriately selected. In addition, a voltage threshold or current threshold can be a voltage range or current range. That is, a suitable conventional voltage detector or current detector may be used that enables its corresponding switch when the voltage or current of the control signal is within a range of voltages or currents and vice versa.

For the circuitry in FIG. 5, it can be assumed that voltage threshold $V_{th2}$ is greater than voltage threshold $V_{th1}$, and that current threshold $I_{th2}$ is greater than current threshold $I_{th1}$. Thus, as the voltage of the control signal decreases, input signal B will be coupled via switch 505 to operational amplifier 510 before input signal A. Similarly, as the absolute value of the current (that is the magnitude of the current regardless of whether the current is being sourced on sinked) of the control signal increases, input signal C will be coupled via switch 508 to operational amplifier 510 before input signal D. For this particular set of voltage thresholds and current thresholds, the output signal from operational amplifier 510 is either muted, $-K_2B$, $-K_3C$, $-K_1A-K_2B$, $-K_2B-K_3C$, $-K_3C-K_4D$, $-K_1A-K_2B-K_3C$, $-K_2B-K_3C-K_4D$, or $-K_1A-K_2B-K_3C-K_4D$, where A is input signal A, B is input signal B, C is input signal C, D is input signal D, $K_1$ is the ratio of resistor 512 to resistor 514, $K_2$ is the ratio of resistor 512 to resistor 515, $K_3$ is the ratio of resistor 512 to resistor 518 and $K_4$ is the ratio of resistor 512 to resistor 519.

Figure 6:
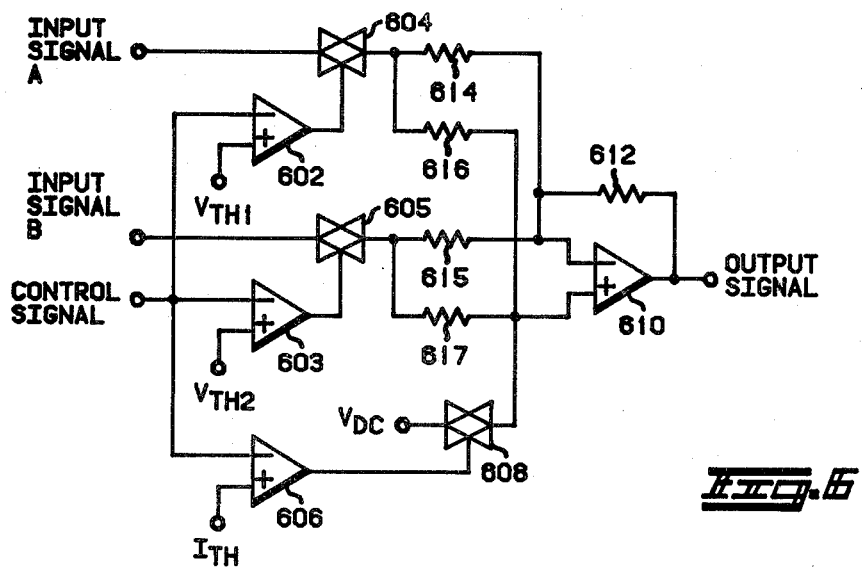
FIG. 6 is a block diagram of yet a further arrangement of amplifying circuitry embodying the present invention.

Referring to FIG. 6, there is illustrated yet another arrangement of amplifying circuitry utilizing the multi-state control circuitry of the present invention. The circuitry in FIG. 6 is similar to that in FIG. 1 in that the output signal of operational amplifier 610 can be muted or can provide positive or negative amplification. However, the number of input signals has been increased from one for the circuitry in FIG. 1 to two for the circuitry in FIG. 6. The voltage thresholds for voltage detectors 602 and 603 can be set at pre-selected voltages or can be voltage ranges, as explained hereinabove with respect to FIG. 5.

Assuming that the voltage threshold $V_{th2}$ for voltage detector 603 is greater than the voltage threshold $V_{th1}$ for voltage detector 602, the output signal from operational amplifier 610 is either muted, $+B$, $-K_2B$, $(K_4-K_1K_3)A+(K_3-K_2K_4)B$, or $-K_1A-K_2B$, where A is input signal A, B is input signal B, $K_1$ is the ratio of resistor 612 to resistor 614, $K_2$ is the ratio of resistor 612 to resistor 615, $K_3$ is the ratio of resistor 616 to the sum of resistors 616 and 617, and $K_4$ is the ratio of resistor 617 to the sum of resistors 616 and 617. Thus, it can be seen from the circuitry in FIGS. 5 and 6 that many variations of circuitry embodying the present invention are possible depending on the desired functions to be provided.

In summary, multi-state control circuitry has been described that can selectively couple a plurality of input signals to output signal utilization circuitry by varying the current and voltage of a single control signal. The multi-state control circuitry can be utilized to provide different amounts of amplification to one or more input signals and can further provide either positive or negative amplification. The multi-state control circuitry is ideally suited for applications where the number of control signals must be minimized. For example, amplifying circuitry embodying the present invention may be advantageously utilized in an integrated circuitry for controlling the muting and amplification of audio signals in a portable radiotelephone such as that described in the related U.S. patent applications listed hereinabove, in U.S. Pat. No. 3,906,166, in a developmental cellular radiotelephone system application, filed by Motorola and American Radio-Telephone Service, Inc. under docket number 18262 with the Federal Communications Commission in Feb. 1977 and in a paper entitled "Portable Telephones for Cellular Systems," by Albert J. Leitich and Donald L. Linder, presented at the 30th Annual Conference of the IEEE Vehicular Technology Society on Sept. 15 to 17, 1980, in Dearborn, Michigan. Moreover, it is to be understood that the present invention may not only be utilized in amplifying circuitry for controlling the combining and amplifying of a plurality of input signals, but also may be utilized in any suitable circuitry for controlling the application thereto of a plurality of input signals.

I claim:

1. Circuitry for controlling the application of one of first and second input signals from corresponding first and second signal sources to output signal utilization means, comprising:

signal source means for providing a control signal having one of first and second predetermined voltages and one of first and second predetermined currents;

voltage detecting means coupled to the control signal source means for generating a first state of a first output signal when the control signal has said first predetermined voltage and a second state of the first output signal when the control signal has said second predetermined voltage;

current detecting means coupled to the control signal source means for generating a first state of a second output signal when the control signal has said first predetermined current and a second state of the second output signal when the control signal has said second predetermined current;

first switching means for coupling the first input signal to the output signal utilization means in response to the first state of the first output signal and decoupling the first input signal from the output signal utilization means in response to the second state of the first output signal; and second switching means for coupling the second input signal to the output signal utilization means in response to the first state of the second output signal and decoupling the second input signal from the output signal utilization means in response to the second state of the second output signal.

2. The control circuitry according to claim 1, further adapted to control the application of a third input signal from a third signal source to said output signal utilization means, said control signal source means further providing a third predetermined voltage of the control signal, and said control circuitry further including:

second voltage detecting means coupled to the control signal source means for generating a first state of a third output signal when the control signal has said first or second predetermined voltage and a second state of the third output signal when the control signal has said third predetermined voltage; and third switching means for coupling the third input signal to the output signal utilization means in response to the first state of the third output signal and decoupling the third input signal from the output signal utilization means in response to the second state of the third output signal.

3. The control circuitry according to claim 1, further adapted to control the application of a third input signal from a third signal source to said output signal utilization means, said control signal source means further providing a third predetermined current of the control signal, and said control circuitry further including:

second current detecting means coupled to the control signal source means for generating a first state of a third output signal when the control signal has said first or second predetermined current and a second state of the third output signal when the control signal has said third predetermined current; and third switching means for coupling the third input signal to the output signal utilization means in response to the first state of the third output signal and decoupling the third input signal from the output signal utilization means in response to the second state of the third output signal.

4. Circuitry for controlling the application of one of first and second input signals from corresponding first and second signal sources to output signal utilization means, comprising:

signal source means for providing a control signal having one of first and second predetermined voltages and one of first and second predetermined currents;

voltage detecting means coupled to the control signal source means for generating a first state of a first output signal when the control signal has said first predetermined voltage and a second state of the first output signal when the control signal has said second predetermined voltage;

current detecting means coupled to the control signal source means for generating a first state of a second output signal when the control signal has said first predetermined current and a second state of the second output signal when the control signal has said second predetermined current;

amplifying means having a first input, a second input coupled to a predetermined reference voltage and an output coupled to the output signal utilization means, the amplifying means providing a predetermined amplification to signals coupled to its first input;

first switching means for coupling the first input signal to the first input of the amplifying means in response to the first state of the first output signal and decoupling the first input signal from the first input of the amplifying means in response to the second state of the first output signal; and second switching means for coupling the second input signal to the first input of the amplifying means in response to the first state of the second output signal and decoupling the second input signal from the first input of the amplifying means in response to the second state of the second output signal.

5. The control circuitry according to claim 4, wherein said amplifying means is an operational amplifier having a feedback resistor coupled from its output on its first input, a first input resistor coupled from the first input to the first switching means and a second resistor coupled from the first input to the second switching means, the amplification of the first and second signals being determined by the magnitude of the first and second resistors, respectively, and the magnitude of the feedback resistor.

6. The control circuitry according to claim 4 or 5, wherein said voltage detecting means includes comparing means for comparing the voltage of the control signal to a threshold voltage having a value between the value of the first and second predetermined voltages, said voltage detecting means generating the first state of the first output signal when the voltage of the control signal is less than the threshold voltage and the second state of the first output signal when the voltage of the control signal is greater than the threshold voltage.

7. The control circuitry according to claim 4 or 5, wherein said current detecting means includes comparing means for comparing the current of the control signal to a threshold current having a value between the value of the first and second predetermined currents, said current detecting means generating the first state of the second output signal when the current of the control signal is greater than the threshold current and the second state of the second output signal when the current of the control signal is less than the threshold current.

8. The control circuitry according to claim 4, further adapted to control the application of a third input signal from a third signal source to said output signal utilization means, said control signal source means further providing a third predetermined voltage of the control signal, and said control circuitry further including:

second voltage detecting means coupled to the control signal source means for generating a first state of a third output signal when the control signal has said first or second predetermined voltage and a second state of the third output signal when the control signal has said third predetermined voltage; and third switching means for coupling the third input signal to the first input of the amplifying means in response to the first state of the third output signal and decoupling the third input signal from the first input of the amplifying means in response to the second state of the third output signal.

9. The control circuitry according to claim 4, further adapted to control the application of a third input signal from a third signal souce to said output signal utilization means, said control signal source means further providing a third predetermined current of the control signal, and said control circuitry further including:
second current detecting means coupled to the control signal source means for generating a first state of a third output signal when the control signal has said first or second predetermined current and a second state of the third output signal when the control signal has said third predetermined current; and
third switching means for coupling the third input signal to the first input of the amplifying means in response to the first state of the third output signal and decoupling the third input signal from the first input of the amplifying means in response to the second state of the third output signal.

10. The control circuitry according to claim 8 or 9, wherein said amplifying means is an operational amplifier having a feedback resistor coupled from its output to its first input, a first input resistor coupled from the first input to the first switching means, a second resistor coupled from the first input to the second switching means and a third resistor coupled from the first input to the third switching means, the amplification of the first, second and third signals being determined by the magnitude of the first, second and third resistors, respectively, and the magnitude of the feedback resistor.

11. Circuitry for controlling the application of an input signal from a signal source to output signal utilization means, comprising:
signal source means for providing a control signal having one of first and second predetermined voltages and one of first and second predetermined currents;
voltage detecting means coupled to the control signal source means for generating a first state of a first output signal when the control signal has said first predetermined voltage and a second state of the first output signal when the control signal has said second predetermined voltage;
current detecting means coupled to the control signal source means for generating a first state of a second output signal when the control signal has said first predetermined current and a second state of the second output signal when the control signal has said second predetermined current;
amplifying means having first and second inputs and an output coupled to the output signal utilization means, the amplifying means providing a predetermined negative amplification to a signal coupled to its first input when its second input is coupled to a reference voltage and a predetermined positive amplification to a signal coupled to both its first and second inputs;
first switching means for coupling the input signal to the first and second inputs of the amplifying means in response to the first state of the first output signal and decoupling the input signal from the first and second inputs of the amplifying means in response to the second state of the first output signal; and
second switching means for coupling a predetermined reference voltage to the second input of the amplifying means in response to the first state of the second output signal and decoupling the predetermined reference voltage from the second input of the amplifying means in response to the second state of the second output signal.

12. The control circuitry according to claim 11, wherein said amplifying means is an operational amplifier having a feedback resistor coupled from its output to its first input, a first input resistor coupled from the first input to the first switching means and a second resistor coupled from the second input to the first switching means.

13. The control circuitry according to claim 11 or 12, wherein said voltage detection means includes comparing means for comparing the voltage of the control signal to a threshold voltage having a value between the value of the first and second predetermined voltages, said voltage detecting means generating the first state of the first output signal when the voltage of the control signal is less than the threshold voltage and the second state of the first output signal when the voltage of the control signal is greater than the threshold voltage.

14. The control circuitry according to claim 11 or 12, wherein said current detecting means includes comparing means for comparing the current of the control signal to a threshold current having a value between the value of the first and second predetermined currents, said current detecting means generating the first state of the second output signal when the curent of the control signal is less than the threshold current and the second state of the second output signal when the current of the control signal is greater than the threshold current.

15. The control circuitry according to claim 11, further adapted to control the application of a second input signal from a second signal source to output signal utilization means, said signal source means further providing a third predetermined voltage of the control signal, said control circuitry further including:
second voltage detecting means coupled to the control signal source means for generating a first state of a third output signal when the control signal has said first or second predetermined voltage and a second state of the third output signal when the control signal has said third predetermined voltage;
third switching means for coupling the second input signal to the first and second inputs of the amplifying means in response to the first state of the third output signal and decoupling the second input signal from the first and second inputs of the amplifying means in response to the second state of the third output signal.

16. The control circuitry according to claim 11, further adapted to control the application of a second input signal from a second signal source to said output signal utilization means, said control signal source means further providing a third predetermined current of the control signal, and said control circuitry further including:
second current detecting means coupled to the control signal source means for generating a first state of a third output signal when the control signal has said first or second predetermined current and a second state of the third output signal when the control signal has said third predetermined current; and third switching means for coupling the second input signal to the first and second inputs of the amplifying means in response to the first state of the third output signal and decoupling the second input signal from the first and second inputs of the amplifying means in response to the second state of the third output signal.

17. The control circuitry according to claim 15 or 16, wherein said amplifying means is an operational amplifier having a feedback resistor coupled from its output to its first input, a first input resistor coupled from the first input to the first switching means, a second resistor coupled from the second input to the first switching means, a third resistor coupled from the first input to the second switching means and a fourth resistor coupled from the second input to the second switching means.

* * * * *

UNITED STATES PATENT AND TRADEMARK OFFICE
CERTIFICATE OF CORRECTION

PATENT NO. : 4,455,534

DATED : June 19, 1984

INVENTOR(S) : Steven F. Gillig

It is certified that error appears in the above-identified patent and that said Letters Patent is hereby corrected as shown below:

In column 8, line 27, (claim 5), delete "on" and insert --to--.

In column 10, line 18, (claim 13), delete "detection" and insert --detecting--.

Signed and Sealed this

Fifteenth Day of January 1985

[SEAL]

Attest:

GERALD J. MOSSINGHOFF

Attesting Officer

Commissioner of Patents and Trademarks